US011422173B2

(12) United States Patent
Ranganathan et al.

(10) Patent No.: US 11,422,173 B2
(45) Date of Patent: Aug. 23, 2022

(54) METHOD AND APPARATUS FOR ACCURATE MEASUREMENT OF PLATFORM POWER

(71) Applicant: Intel Corporation, Santa Clara, CA (US)

(72) Inventors: Sriram Ranganathan, Bangalore (IN); Naveen G, Bangalore (IN); Pannerkumar Rajagopal, Bangalore (IN); Govindaraj Gettimalli, Bangalore (IN); Javahar Ragothaman, Tamilnadu State (IN)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 17/109,031

(22) Filed: Dec. 1, 2020

(65) Prior Publication Data

US 2021/0349134 A1    Nov. 11, 2021

(30) Foreign Application Priority Data

May 9, 2020  (IN) .............................. 202041019672

(51) Int. Cl.
*G01R 21/133*     (2006.01)
*G06F 1/32*       (2019.01)
*G06F 1/3234*     (2019.01)
*G06F 1/3246*     (2019.01)

(52) U.S. Cl.
CPC ......... *G01R 21/133* (2013.01); *G06F 1/3243* (2013.01); *G06F 1/3246* (2013.01)

(58) Field of Classification Search
CPC .... G01R 21/133; G06F 1/3243; G06F 1/3246
See application file for complete search history.

(56) References Cited

U.S. PATENT DOCUMENTS

| 6,144,187 | A | * | 11/2000 | Bryson | ............... | H02J 7/00712 |
| | | | | | | 320/137 |
| 2005/0114905 | A1 | * | 5/2005 | Song | ............... | H04N 21/43615 |
| | | | | | | 725/132 |
| 2012/0246506 | A1 | * | 9/2012 | Knight | ............... | G06F 11/3058 |
| | | | | | | 713/340 |
| 2013/0257168 | A1 | * | 10/2013 | Singh | ..................... | H02J 50/60 |
| | | | | | | 307/104 |
| 2014/0281625 | A1 | * | 9/2014 | Younger | ............... | G06F 1/3206 |
| | | | | | | 713/323 |
| 2014/0298042 | A1 | * | 10/2014 | Ogura | .................. | H04L 9/0894 |
| | | | | | | 713/193 |

(Continued)

*Primary Examiner* — Robert A Cassity
(74) *Attorney, Agent, or Firm* — Schwabe, Williamson & Wyatt, P.C.

(57) ABSTRACT

A Power Management Controller (PMC) which manages power states of a platform, informs a power accumulator device to start measuring the platform power during entry into the low power state (e.g., S0iX). The power accumulator device starts measuring the power until a stop message comes from the PMC. The PMC on detection of any wake event initiates a stop message to the power accumulator device. Once an operating system (OS) context is restored, software can read the measured data from the power accumulator device. The measured data is accessible to a host software using standard software application programming interface (API) and can be used to influence the power policies of the system.

18 Claims, 6 Drawing Sheets

(56) References Cited

U.S. PATENT DOCUMENTS

2015/0362974 A1* 12/2015 Chau .................... G06F 1/325
                                                          713/322
2015/0370681 A1* 12/2015 Tonry .................... G06F 11/24
                                                          702/58

* cited by examiner

METHOD AND APPARATUS FOR ACCURATE MEASUREMENT OF PLATFORM POWER

CLAIM FOR PRIORITY

This application claims the benefit of priority of Indian Patent Application No. 202041019672, filed on May 9, 2020, titled "METHOD AND APPARATUS FOR ACCURATE MEASUREMENT OF PLATFORM POWER," and which is incorporated by reference in entirety.

BACKGROUND

Battery life is one of the key vectors of an Intel client platform which plays a significant role in defining the end-user experience. There is a compelling need driven by Energy Certification Authorities (e.g., California Energy Commission, Energy Star, etc.) to measure the power consumption of the critical platform components during system active state (S0) and in system sleep state (S0iX).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
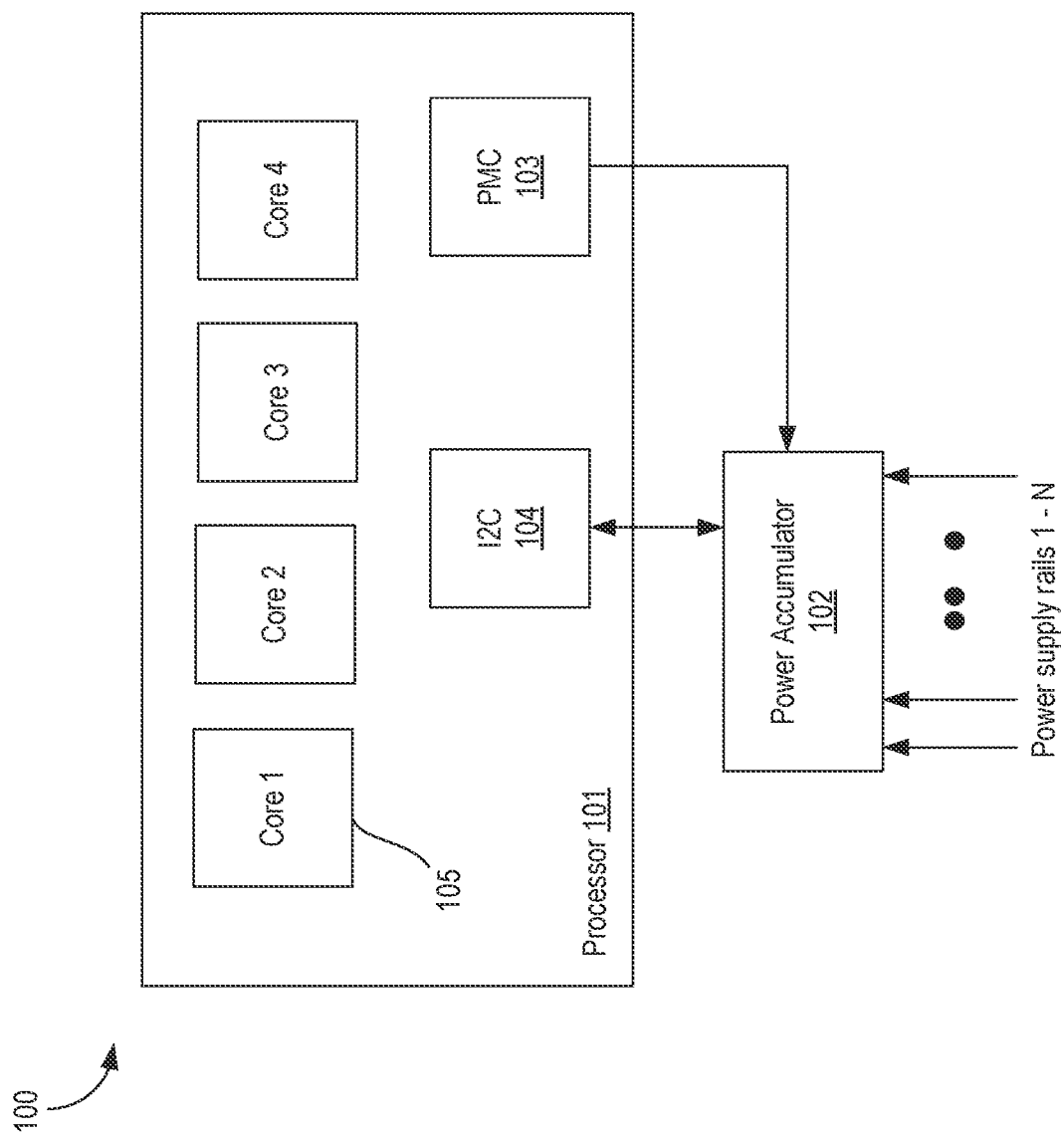
FIG. 1 illustrates a system-on-chip with power accumulator to measure system power, in accordance with some embodiments.

Various embodiments disclose a method and apparatus to accurately measure system power of a platform when a system of the platform is in a deep low power state (e.g., S0iX) without the need for any external power measurement instrument. A core logic uses an onboard power accumulator device, corresponding software drivers, and a power management controller (PMC) within a system-on-chip (SoC) to measure the system power when the platform is in deep sleep state (e.g., S0iX). A typical platform contains several voltage rails (e.g., VCCCORE, VCCGT, VCCSA, VCCRING, VCCIO, VCCL2, VNNAON, VCCST etc.), which drives power to processor cores, graphics unit, and other hardware components of the SoC. Various embodiments provide the ability to measure the overall platform power as well as individual component power.

In some embodiments, the PMC, which is responsible for managing the power states of the platform, informs the power accumulator device to start measuring the platform power during entry into the low power state (e.g., S0iX). The power accumulator device starts measuring the power until a stop message comes from the PMC. The PMC on detection of any wake event initiates a stop message to the power accumulator device. Once an operating system (OS) context is restored, software can read the measured data (e.g., measured power) from the power accumulator The measured data is accessible to a host software using standard software application programming interface (API) and can be used to influence the power policies of the system. For example, the measured data is used by the host software to learn, adapt and dynamically adjust the behavior of the platform based on end-user power needs and also for reporting the energy consumption for better power budgeting. In various embodiments, the measured data is self-contained within the host system to allow for native access to the measured data by the software and the operating system.

There are many technical effects of various embodiments. For example, the host software and OS have direct access to the measured data, and that access enables application aware power computing. The scheme of various embodiments is non-intrusive and may not use the processor(s) of the SoC to measure power data. The scheme is accurate and low cost, and supports power measurement at both system active state (e.g., S0) and system sleep state (e.g., SoiX). Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" here generally refers to any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates apparatus 100 with system-on-chip 101 with power accumulator 102 to measure system power, in accordance with some embodiments. SoC 101 is a processor, which is a simplified version of the SoC described with reference to FIG. 6. Processor 101 comprises power management controller 103, I/O interface 104 (e.g., I2C interface) to communicate with power accumulator 102, and multiple processor cores 105. Power accumulator 102 comprises hardware such as sensors to measure the power from various power supply rails. For example, power accumulator 102 includes current and voltage sensors to measure voltage across a resistor in series with voltage regulators providing power to the power supply rails. Compared to the power consumed by SoC 101, power accumulator 102 consumes very low power (e.g., less than 1 mW).

While four cores are shown, processor 101 can have any number of processor cores. The cores can be all of the same capability (i.e., symmetric) or of different capabilities and sizes (e.g., asymmetric). Power accumulator 102 receives a number of power supply rails (e.g., VCCCORE, VCCGT, VCCSA, VCCRING, VCCIO, VCCL2, VNNAON, VCCST etc.), which drive power to processor cores, graphics unit, and other hardware components of SoC 101.

In some embodiments, PMC 103 which is responsible for managing the power states of the platform, including that of SoC 101, and informs power accumulator 102 to start measuring the platform power from the power supply rails during entry into the low power state (e.g., S0iX). PMC 103 comprises hardware and/or software to initiate and stop power measurement via messages to power accumulator 102. Any suitable protocol can be used to send and receive messages to and from power accumulator 102. In some embodiments, PMC 103 communicates with power accumulator 102 directly via a detected pin. In some embodiments, PMC 103 communicates with power accumulator 102 via I2C interface 104.

While various embodiments are illustrated for measuring power during deep sleep state S0iX, the embodiments are not limited to that state alone. For example, the embodiments can be used to measure power during other low power states such as those described in the Advanced Configuration and Power Interface (ACPI) specification Version 6.2 released January 2019.

In some embodiments, power accumulator 102 starts measuring the power on the power supply rails until a stop message comes from PMC 103. PMC 103 on detection of any wake event initiates a stop message to power accumulator 102. After initiation of the stop message and once the operating system context is restored, software can read the measured data from power accumulator 102. The software (e.g., host software) provides an interface (e.g., API) to power accumulator 102 and reports out the measured data to the OS or any other software.

Understanding why a system consumes more power than expected is helpful. For example, after downloading a patch if the system's C state (a power stated defined by the ACPI specification) is broken, this will lead to more power consumption and hence will drain the battery. Various embodiments allow to measure power at run time measure before and after a system patch is installed and ensures battery life is not compromised.

Figure 2:
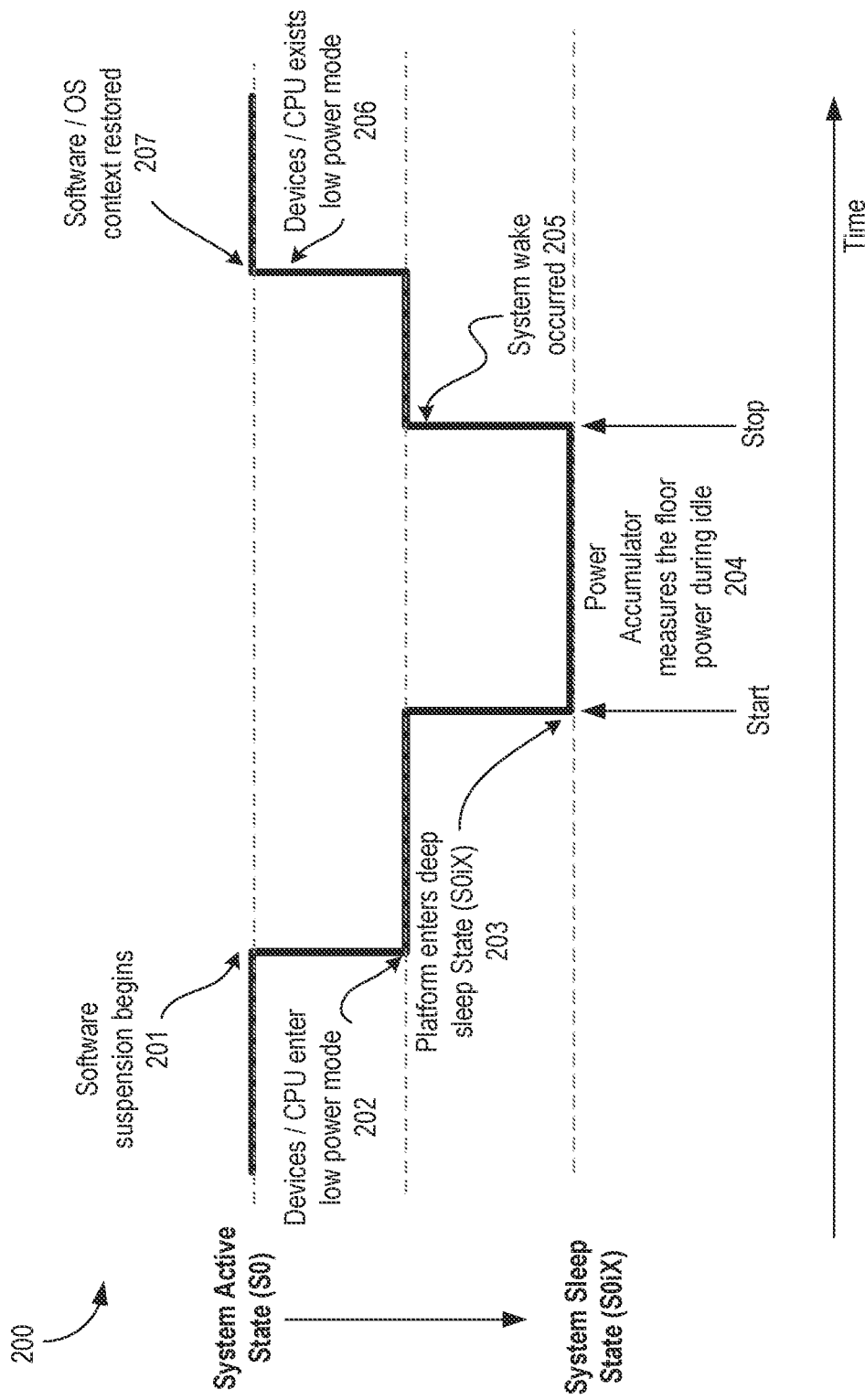
FIG. 2 illustrates a high-level timing diagram showing when the power accumulator measures system power, in accordance with some embodiments.

FIG. 2 illustrates high-level timing diagram 200 showing when the power accumulator measures system power, in accordance with some embodiments. Diagram 200 shows SoC 101 operating in normal active state (e.g., S0 state) and transitioning to a low power mode such as system sleep state S0iX. The transition begins by software suspending operating at timing point 201. SoC 101 then enters low power mode 202. In some embodiments, SoC 101 continues to perform some activities during the low power mode 202, and OS continues to execute on SoC 101. While various embodiments are described with reference to measuring power at the lowest or deepest sleep or power state, power accumulator 102 can also measure power at any of the power states.

After entering a low power mode, the platform (e.g., SoC 101) enters deep sleep state (e.g., S0iX) 203. Power accumulator 102 starts to measure the power from the various power supply rails or power supply lines. Power accumulator 102 will starting measuring the power from the power supply rails until a stop message is received by PMC 103. The power measuring duration is indicated by identifier 204. During the transition to system sleep state (S0iX), the OS suspends all the software applications and parks the devices in low power state by removing the device power and platform power. Without the scheme of various embodiments, in the absence of device power (e.g., power to SoC 101) it is challenging to measure the floor power when the system is in deep sleep state (S0iX) given there will be no software or device available to measure the power.

Power accumulator 102 stops measuring the power when an OS or another device wakes up the system as indicated by reference 205. As the system wakes up, SoC 101 transitions from deep power state (e.g., S0iX) to higher active states and finally exits from the low power state as indicated by reference 206. PMC 102 on detection of any wake event initiates a stop message to power accumulator 101. Software and/or OS context is then restored as indicated by reference 207. Once the OS context is restored, the software can read the measured data from power accumulator 102.

Figure 3:
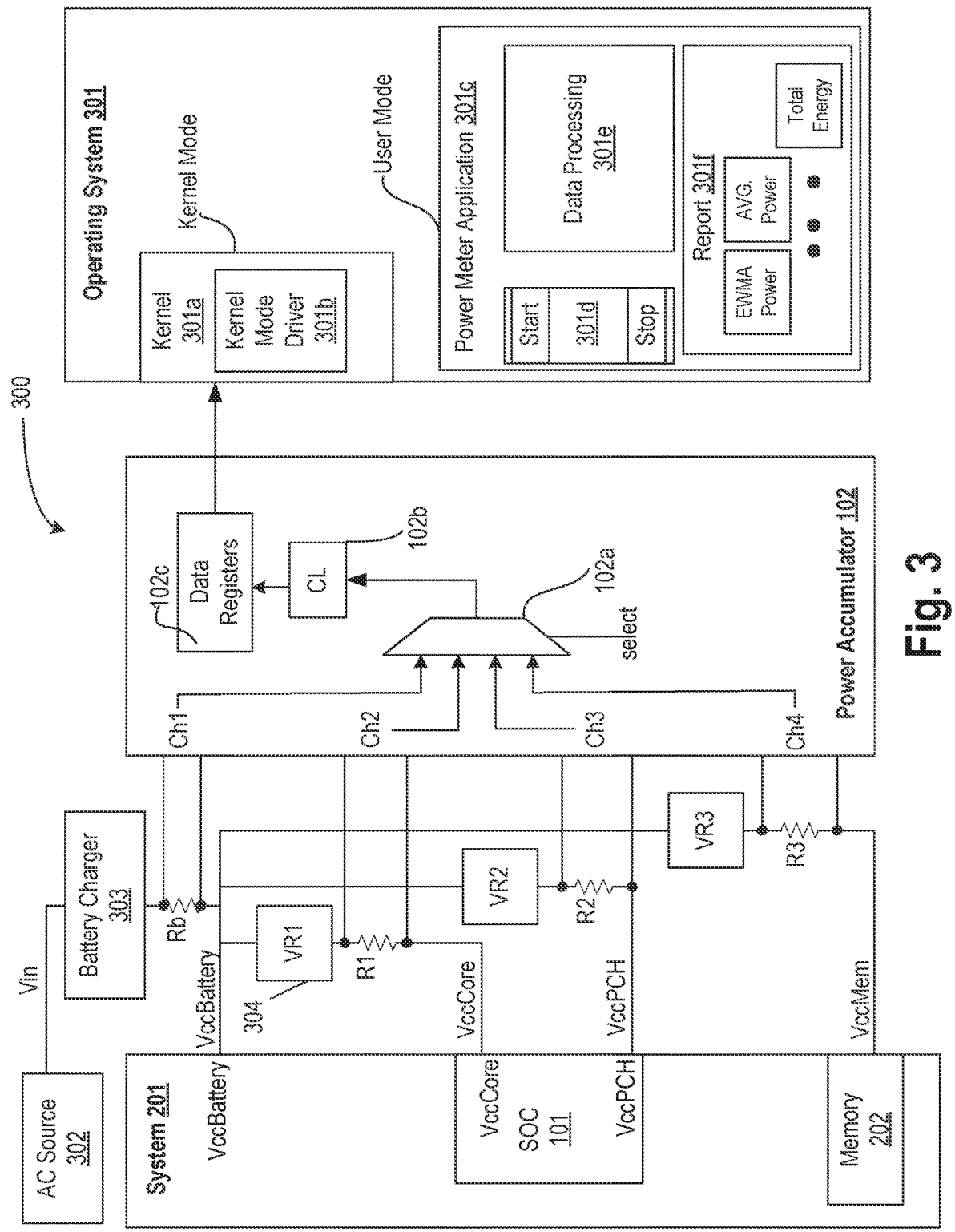
FIG. 3 illustrates system architecture to accurately measure platform power by a host software when a system-on-chip of the platform is in low power mode (e.g., S0iX), in accordance with some embodiments.

FIG. 3 illustrates system architecture 300 to accurately measure platform power by a host software when a system-on-chip of the platform is in low power mode (e.g., S0iX), in accordance with some embodiments. Architecture 300 comprises system 201, power accumulator 102, operating system 301, alternating current (AC) source 302, battery charger 303, voltage regulators 304, and sense resistors (e.g., Rb, R1, R2, R3 for VR1, VR2, and VR3, respectively). A simplified version of system 201 is illustrated having SoC 101 and memory 202. A more detailed version of system 201 is described with reference to FIG. 6.

Referring back to FIG. 3, system 201 receives multiple power supplies generated from different voltage regulators. For example, battery charger 303 generates a VccBattery from input supply Vin provided by AC source 302, which may be coupled to a wall electrical socket. VccCore is generated by VR1 from input supply VccBattery. VccPCH is generated by VR2 from input supply VccBattery. VccMem is generated by VR3 from input supply VccBattery. While four power supply rails are shown, any number of power supply rails may be coupled to System 301. In some embodiments, power accumulator 102 is coupled to the various power supplies to sense voltage and/or current through them. In this example, power accumulator 102 is shown with four channels, Ch1, Ch2, Ch3, and Ch4. However, power accumulator 102 can be coupled to any number of one or more channels. Here, each channel is coupled to a corresponding power supply rail. For example, Ch1 is coupled to resistor Rb on power supply rail VccBattery; Ch2 is coupled to resistor R2 on power supply rail VccVore; Ch3 is coupled to resistor R3 on power supply rail VccPCH; and Ch4 is coupled to resistor R4 on power supply rail VccMem.

Power accumulator 102 comprises multiplexer 102a, combinational logic (CL) 102b, and data registers 102c. Inputs of multiplexer 102a are coupled to the one or more channels. Multiplexer 102a selects one channel at a time via a select bit code controlled by a finite state machine (not shown). In some embodiments, multiplexer 102a is an analog multiplexer controllable by a digital select bit code (e.g., digital signal). In some embodiments, power accumulator 102 is powered by an always-on (AON) power supply. As such, power accumulator 102 may not enter deep low power states so it can operate and measure the power of the one or more power supply rails. The output of multiplexer 102a is an analog output which is then converted to a digital representation by an analog-to-digital converter (ADC) in CL 102b.

An ADC is an apparatus that converts continuous physical quantities (e.g., voltages) to digital numbers that represent the amplitude of the physical quantities. Any suitable ADC may be used to implement the ADC in CL 102b. For example, the ADC is one of: direct-conversion ADC (for flash ADC), two-step flash ADC, successive-approximation ADC (SAR ADC), ramp-compare ADC, Wilkinson ADC, integrating ADC, delta-encoded ADC or counter-ramp, pipeline ADC (also called sub-ranging quantizer), sigma-delta ADC (also known as a delta-sigma ADC), time-interleaved ADC, ADC with intermediate FM stage, or time-stretch ADC. For purposes of explaining the various embodiments, the ADC here is considered to be a flash ADC.

CL 102b generates the digital representation of the analog measurement of the power on a channel. This digital presentation is then stored in data registers 102c. So as not to obscure the various embodiments, current sensors and/or voltage sensors at the input or output of multiplexer 102a are not shown. These current sensors and/or voltage sensors measure the voltage and/or current associated with a particular channel and then the output of the sensors is converted to digital form by the ADC for CL 102b.

In some embodiments, operating system 301 reads data (e.g., measured power data) from data registers 102c via a driver. For example, kernel 301a having driver 301b reads the data from data registers 102c. The reading of data occurs in kernel mode while processing of the data happens in user mode. In user mode, power meter application 301c executing over OS 301 can perform post processing of the measured data. Power meter application 301c may include knobs for duration of power measurement as indicated by the start and stop knobs 301d. Data processing logic 301e performs heuristics on the measured data. For example, data processing 301e compares the current measured data with previous measured data to determine any trends. Report logic 301f is used to generate any standard or customized report such as exponentially weighted moving average power (EWMA), average power (AVG. Power), total energy, etc.

Figure 4:
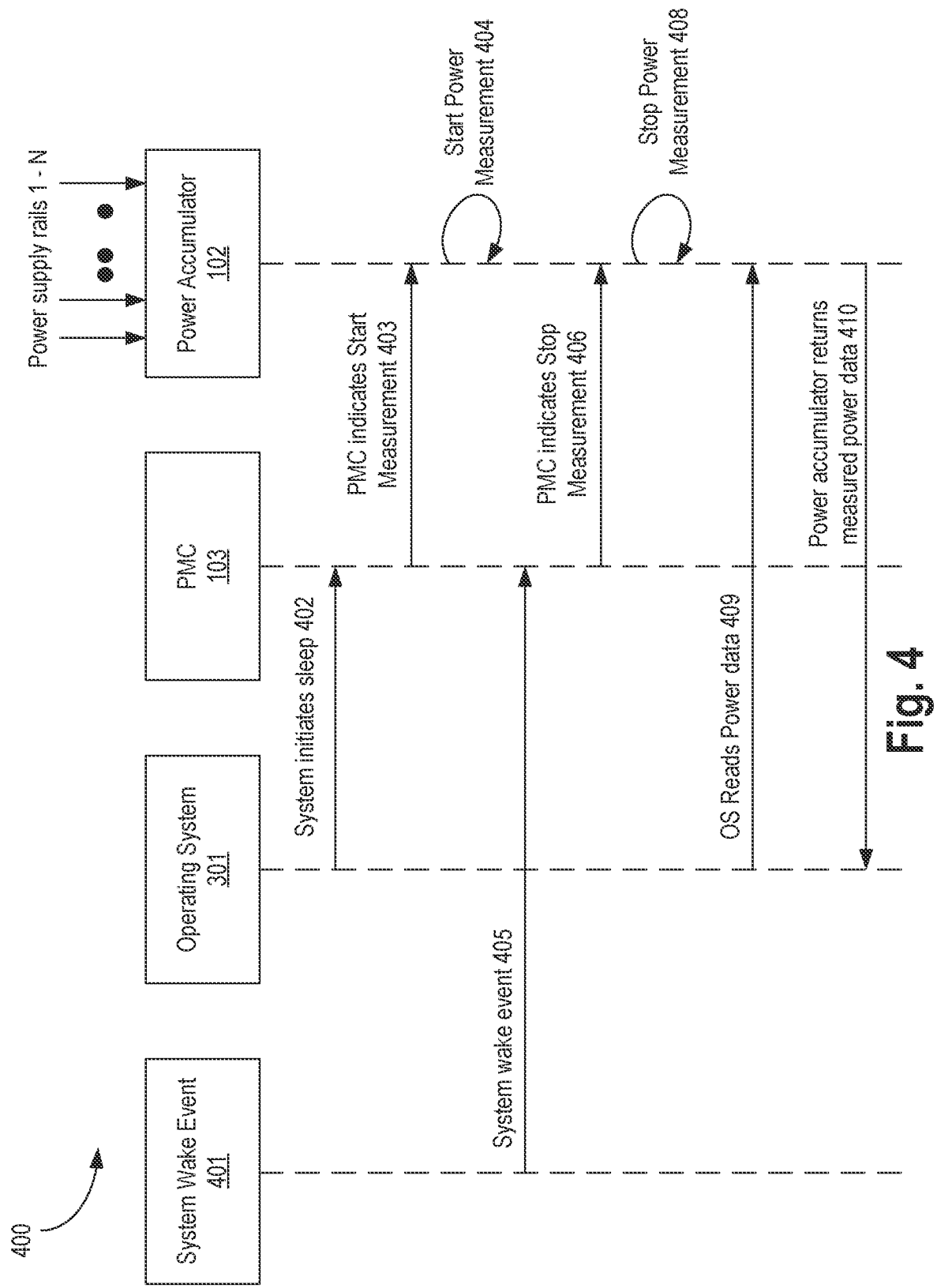
FIG. 4 illustrates an event flowchart to accurately measure platform power by a host software when a system-on-chip of the platform is in low power mode (e.g., S0iX), in accordance with some embodiments.

FIG. 4 illustrates event flowchart 400 to accurately measure platform power by a host software when a system-on-chip of the platform is in low power mode (e.g., S0iX), in accordance with some embodiments. Flowchart 400 summarizes the messaging protocol between OS 301, PMC 103, power accumulator 102, and logic 401 that initiates the system wake event.

In various embodiments, OS 301 initiates system sleep as indicated by arrow 402. OS 301 informs PMC 103 to start the low power mode for SoC 101. PMC 102 identifies the appropriate stage in the system sleep flow to initiate the power measurement when the system is transitioning from system active state (S0) to system low power state (S0iX). In some embodiments, PMC 102 toggles the general purpose I/O (GPIO) signal on a GPIO interface to low, which is an indication to the power accumulator 102 to reset the counters and start measuring power. This is indicated by arrow 403. Power Accumulator 103 starts measuring the platform power and logs the data internally in data register 102c as indicated by arrow 404.

On a platform wake event, as indicated by arrow 405, PMC 103 asserts the GPIO signal to high. This indication 406 notifies power accumulator 102 to stop measuring floor power as indicated by arrow 408. PMC 103 brings back SoC 101 to active state (e.g., S0) and the OS context is restored. OS 301 then reads the measured data from power accumulator 102 as indicated by arrow 409. Power accumulator 102 returns the measured power to OS 301 data as indicated by arrow 410. In some embodiments, in user mode, applications such as Power Meter Tool by Intel® can be used to analyze the data. In some embodiments, the Power Meter Tool reads the stored data from power accumulator 102 using I2C commands. The Power Meter Tool may collect the low power readings for multiple cycles and present the relative power data to the user.

Figure 5:
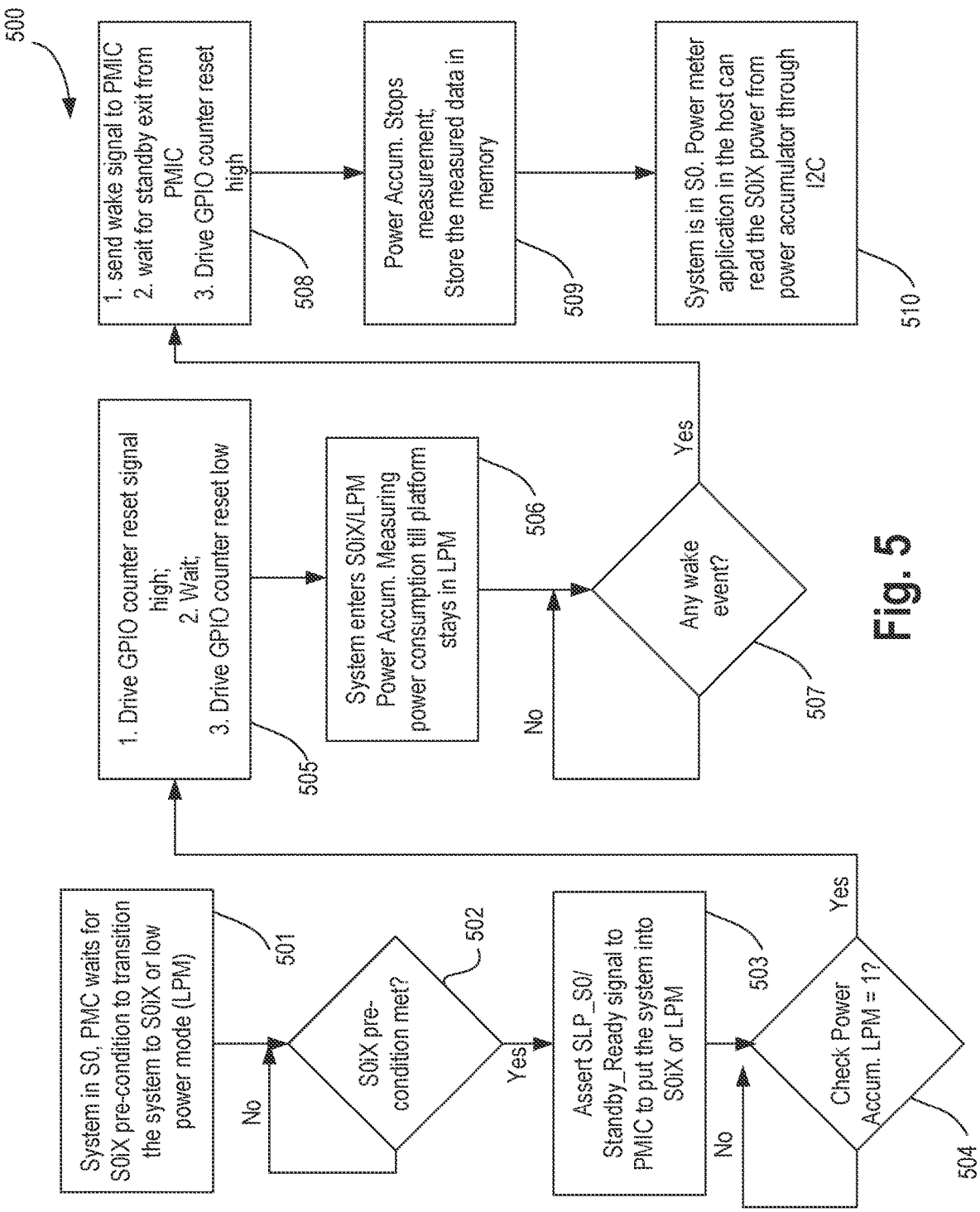
FIG. 5 illustrates logic for general purpose input-output (GPIO) for driving message from a power management controller (PMC) to the power accumulator, in accordance with some embodiments.

FIG. 5 illustrates flowchart 500 for general purpose input-output (GPIO) for driving message from a power management controller (PMC) to the power accumulator, in accordance with some embodiments. While the various blocks are shown in a particular order, the order can be modified. For example, some blocks of flowchart 500 can be performed in parallel to other blocks.

Flowchart 500 begins at block 501 where system (e.g., SoC) is in active state (e.g., S0). PMC 103, which manages the power states, waits for any instruction to enter low power mode. For example, OS 301 sends an event signal indicating desire to enter deep sleep state S0iX or any other low power mode (LPM) to PMC 103. The event signal may indicate an S0iX pre-condition.

At block 502 PMC 103 confirms whether S0iX precondition is met before it begins the process of transitioning to LPM or S0iX state. One example of the S0iX precondition is that various components inside the SoC and in or on the platform (e.g., graphics card, camera, audio, Universal Serial Bus (USB) devices, etc.) are in idle state and enter LPM to allow the platform (and the SoC) to enter the LPM. If the pre-condition is not met, PMC 103 waits for such pre-condition and SoC continues in active mode (e.g., S0 state). If the pre-condition is met, then PMC 103 sends a low power mode signal to a power management integrated circuit (PMIC) to put the SoC and/or the computer platform to S0iX or LPM state as indicated by block 503. One example of PMIC is illustrated by block 2412 of FIG. 6. Referring back to FIG. 5, in one example, PMC 103 asserts SLP_S0 signal or STANDBY_READY signal via its respective pins of SoC 101 to the PMIC. At block 504, PMC 103 checks whether power accumulator 102 is ready to start measurement. For example, PMC 103 checks whether POWER_ACCUMULATOR_LPM ENABLE signal is asserted. POWER_ACCUMULATOR_LPM ENABLE signal may be a signal internal to SoC 101 or a pin of SoC 101 to communicate with power accumulator 102. If PMC 103 determines that power accumulator 102 is ready to start measurement, the process proceeds to block 505.

At block 505, PMC 103 communicates with power accumulator 102 via a GPIO pin of SoC 101 to instruct power accumulator 102 to start power measurement. In one example, PMC 103 drives GPIO_COUNTER_RESET signal (or pin) high to instruct power accumulator to start measurement of power. A counter in power accumulator 102 is reset to zero so that the counter can begin counting from start of low power mode to when the low power mode ends. After PMC 103 drives GPIO_COUNTER_RESET signal (or pin) high, PMC 103 waits for the counter in power accumulator 102 to reset and then drives GPIO_COUNTER_RESET signal (or pin) low to indicate to the counter that it can now begin counting. The process then proceeds to block 506.

At block 506, the computing system enters S0iX or LPM state, and power accumulator 102 begins to measure power on the one or more power supply rails (e.g., rails 1 though N, where 'N' is a number). The counter keeps counting during this process. Power accumulator 102 continues to measure the power so long as it is instructed that the system is in LPM or S0iX state. The process then begins to block 507.

At block 507, PMC 103 keeps a lookout for any wake event to wake up the computing system from LPM or S0iX state. PMC 103 continues to check for any wake event, and once it finds one, the process proceeds to block 508. Otherwise, the process remain in block 507 and power accumulator continues to measure power.

At block 508, PMC 103 sends a wake signal to PMIC and then waits for the PMIC to exit its standby state (low power state). After PMIC exits the standby state, PMC 103 drives a signal on the GPIO to inform power accumulator 102 to stop the measurement. For example, PMC 103 drives a GPIO_COUNTER_RESET pin (or signal) high to inform power accumulator 102 to stop the power measurement process. At block 509, power accumulator 102 receives the instruction from PMC 103 to stop measurement and stores the measured data in memory (e.g., data registers 102c). The process then proceeds to block 510 where the computing system enters normal or active state S0. A host software or any other software such as the Power Meter Tool by Intel® can read the measured power data and perform any analysis on it.

Elements of some embodiments are also provided as a machine-readable medium (e.g., memory) for storing the computer-executable instructions (e.g., instructions to implement any other processes discussed herein). In some embodiments, a computing platform comprises a memory, a processor, a machine-readable storage media (also referred to as tangible machine readable medium), a communication interface (e.g., wireless or wired interface), and a network bus coupling them.

In some embodiments, the processor is a Digital Signal Processor (DSP), an Application Specific Integrated Circuit (ASIC), a general purpose Central Processing Unit (CPU), or a low power logic implementing a simple finite state machine to perform the method of flowcharts 400, 500 and/or various embodiments, etc.

In some embodiments, the various logic blocks of the system are coupled together via the network bus. Any suitable protocol may be used to implement the network bus. In some embodiments, the machine-readable storage medium includes instructions (also referred to as the program software code/instructions) for intelligent prediction of processor idle time as described with reference to the various embodiments and flowchart.

Program software code/instructions associated with flowcharts 400, 500 (and/or various embodiments) and executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with flowchart 200 (and/or various embodiments) are executed by the computer system.

In some embodiments, the program software code/instructions associated with flowchart 400, 500 (and/or various embodiments) are stored in a computer executable storage medium and executed by the processor. Here, computer executable storage medium is a tangible machine readable medium that can be used to store program software code/instructions and data that, when executed by a computing device, causes one or more processors to perform a method(s) as may be recited in one or more accompanying claims directed to the disclosed subject matter.

The tangible machine readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in the same communication session.

The software program code/instructions (associated with flowchart 400, 500 and other embodiments) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium in entirety at a particular instance of time.

Examples of tangible computer-readable media include but are not limited to recordable and non-recordable type media such as volatile and non-volatile memory devices, read only memory (ROM), random access memory (RAM), flash memory devices, magnetic random access memory, ferroelectric memory, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, the tangible machine readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry® Droid®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

Figure 6:
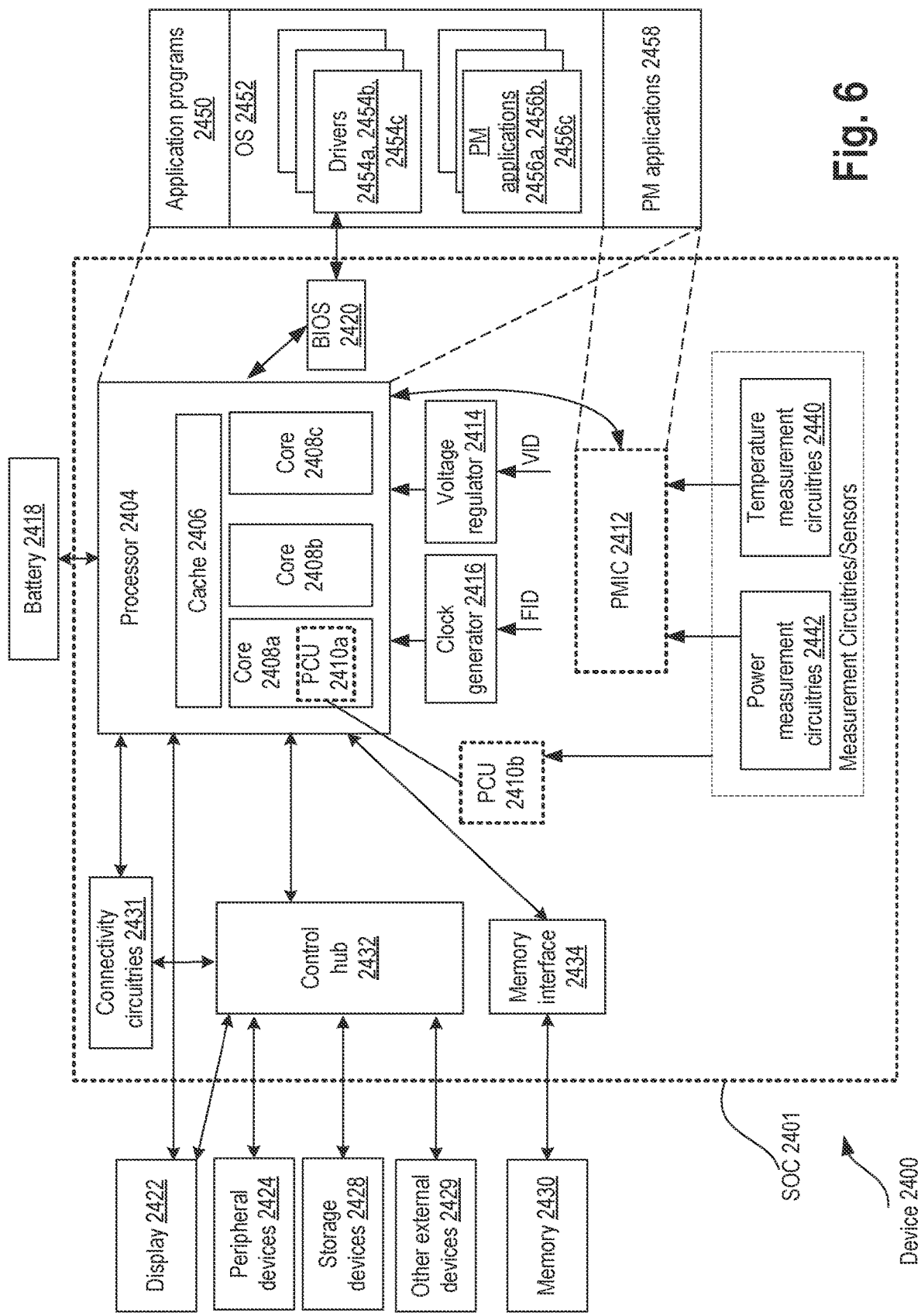
FIG. 6 illustrates a smart device or a computer system or an SoC (System-on-Chip) coupled to a power accumulator accurately measure platform power by a host software when the SoC of the platform is in low power mode (e.g., S0iX), in accordance with various embodiments.

FIG. 6 illustrates a smart device or a computer system or an SoC (System-on-Chip) coupled to a power accumulator (e.g., 2442) accurately measure platform power by a host software when the SoC of the platform is in low power mode (e.g., S0iX), in accordance with various embodiments. It is pointed out that those elements of FIG. 6 having the same reference numbers (or names) as the elements of any other figure can operate or function in any manner similar to that described, but are not limited to such.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 18, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408*a*, 2408*b*, 2408*c*. Although merely three cores 2408*a*, 2408*b*, 2408*c* are illustrated in FIG. 6, processor 2404 may include any other appropriate number of processing cores, e.g., tens, or even hundreds of processing cores. Processor cores 2408*a*, 2408*b*, 2408*c* may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408*a*, a second section of cache 2406 dedicated to core 2408*b*, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc. In some embodiments, power measurement circuitries 2442 includes power accumulator to accurately measure platform power by a host software when the SoC of the platform is in low power mode (e.g., S0iX), in accordance with various embodiments.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410a/b and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410a. In an example, some other sections of PCU 2410 may be implemented outside the processing cores 2408, and these sections of PCU 2410 are symbolically illustrated using a dotted box and labelled as PCU 2410b. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Various embodiments described herein are illustrated as examples. The features of these examples can be combined with one another in any suitable way. These examples include:

Example 1: An apparatus comprising: one or more channels to receive power supply lines; an input to receive instructions from a power management controller to start measurement of power on the power supply lines, and to generate measured data of power in response to a processor being in a low power mode; a memory to store the measured data; and an input-output (I/O) interface to communicate with an operating system, wherein the operating system is to access the measured data.

Example 2: The apparatus of example 1 comprises an analog-to-digital converter (ADC) to convert voltage and/or current on the power supply lines to a digital representation, wherein the measured data corresponds to the digital representation.

Example 3: The apparatus of example 1, wherein the operating system is to initiate the low power mode to the power management controller.

Example 4: The apparatus of example 3, wherein the power management controller is to cause start of measurement of power in response to the initiation of the low power mode by the operating system.

Example 5: The apparatus of example 1, wherein the power management controller is to cause stop of measurement of power in response to a wake event.

Example 6: The apparatus of example 1, wherein the operating system includes an API for an application to process the measured data.

Example 7: The apparatus of example 1, wherein the one or more channels are coupled to one or more voltage regulators.

Example 8: The apparatus of example 1, wherein the power management controller is part of a system-on-chip (SoC).

Example 9: The apparatus of example 1, wherein the instructions include instructions to start power measurement and instructions to stop power measurement.

Example 10: The apparatus of example 1, wherein the input is a general purpose I/O (GPIO) interface.

Example 11: The apparatus of example 1, wherein the low power mode is an S0iX state.

Example 12: An apparatus comprising: a plurality of processor cores; a power management controller (PMC) coupled to the plurality of processor cores and to manage power for the plurality of processor cores and/or to cause the apparatus to enter a low power mode; and an output to communicate with a power accumulator, wherein the PMC is to cause the power accumulator to measure power drawn by the apparatus when the apparatus enters the low power mode.

Example 13: The apparatus of example 12, wherein the PMC is to cause the power accumulator to stop measurement of power drawn by the apparatus when the apparatus exits the low power mode.

Example 14: The apparatus of example 12, wherein the power accumulator is to provide the measured power to an operating system.

Example 15: The apparatus of example 14, wherein the operating system includes an API for an application to process the measured power.

Example 16: The apparatus of example 12, wherein the low power mode is an S0iX state.

Example 17: A system comprising: a power accumulator; a system-on-chip coupled to the power accumulator, wherein the system-on-chip comprises: a plurality of processor cores; a power management controller (PMC) coupled to the plurality of processor cores and to manage power for the plurality of processor cores and/or to cause the system-on-chip to enter a low power mode; and an output to communicate with the power accumulator, wherein the PMC is to cause the power accumulator to measure power drawn by the system-on-chip when the system-on-chip enters the low power mode, wherein the power accumulator to store the measured power as measured data; and an input-output (TO) interface to communicate with an operating system, wherein the operating system is to access the measured data.

Example 18: The system of example 17, wherein the power accumulator comprises an analog-to-digital converter (ADC) to convert voltage and/or current on power supply lines to a digital representation, wherein the power supply lines provide power to the system-on-chip, and wherein the measured data corresponds to the digital representation.

Example 19: The system of example 17, wherein the operating system is to initiate the low power mode to the PMC.

Example 20: The system of example 19, wherein the PMC is to cause start of measurement of power in response to the initiation of the low power mode by the operating system.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   one or more channels to receive power supply lines;
   an input to receive, in response to a processor being placed into a low power mode, instructions from a power management controller (PMC), wherein the instructions are to:
      measure power on respective ones of the power supply lines; and
      generate measured data related to measured power on the respective ones of the power supply lines while the processor is in the low power mode;
   a memory to store the measured data; and
   an input-output (I/O) interface to communicate with an operating system, wherein the operating system is to access the measured data.

2. The apparatus of claim 1 comprises an analog-to-digital converter (ADC) to convert voltage and/or current on the power supply lines to a digital representation, wherein the measured data corresponds to the digital representation.

3. The apparatus of claim 1, wherein the operating system is to initiate the low power mode to the PMC.

4. The apparatus of claim 1, wherein the PMC is to cause stop of measurement of power in response to a wake event.

5. The apparatus of claim 1, wherein the operating system includes an application programming interface (API) for an application to process the measured data.

6. The apparatus of claim 1, wherein the one or more channels are coupled to one or more voltage regulators.

7. The apparatus of claim 1, wherein the power management controller is part of a system-on-chip (SoC).

8. The apparatus of claim 1, wherein the instructions include instructions to start power measurement and instructions to stop power measurement.

9. The apparatus of claim 1, wherein the input is a general purpose I/O (GPIO) interface.

10. The apparatus of claim 1, wherein the low power mode is an S0iX state.

11. An apparatus comprising:
    a plurality of processor cores;
    a power management controller (PMC) coupled to the plurality of processor cores, the PMC to:
       manage power for the plurality of processor cores; and
       cause the apparatus to enter a low power mode; and
    a power accumulator, wherein the PMC is to cause the power accumulator, in response to a processor core of the plurality of processor cores being placed into a low power mode, to:
       measure power drawn by the apparatus while the apparatus is in the low power mode; and
       generate measured data related to the measured power.

12. The apparatus of claim 11, wherein the PMC is to cause the power accumulator to stop measurement of power drawn by the apparatus when the apparatus exits the low power mode.

13. The apparatus of claim 11, wherein the power accumulator is to provide an indication of the measured power to an operating system.

14. The apparatus of claim 13, wherein the operating system includes an application programming interface (API) for an application to process the measured power.

15. The apparatus of claim 11, wherein the low power mode is an S0iX state.

16. A system comprising:
    a power accumulator;
    a system-on-chip coupled to the power accumulator, wherein the system-on-chip comprises:
       a plurality of processor cores;
       a power management controller (PMC) coupled to the plurality of processor cores, the PMC to:
          manage power for the plurality of processor cores; and
          cause the system-on-chip to enter a low power mode; and
       an output to communicate with the power accumulator, wherein the PMC is to cause the power accumulator, in response to a processor core of the plurality of processor cores being placed into a low power mode;
          measure power drawn by the system-on-chip while the system-on-chip is in the low power mode; and
          generate measured data related to the measured power; and
    an input-output (TO) interface to communicate with an operating system, wherein the operating system is to access the measured data.

17. The system of claim 16, wherein the power accumulator comprises an analog-to-digital converter (ADC) to convert voltage and/or current on power supply lines to a digital representation, wherein the power supply lines provide power to the system-on-chip, and wherein the measured data corresponds to the digital representation.

18. The system of claim 16, wherein the operating system is to initiate the low power mode to the PMC.

* * * * *

UNITED STATES PATENT AND TRADEMARK OFFICE
CERTIFICATE OF CORRECTION

PATENT NO. : 11,422,173 B2
APPLICATION NO. : 17/109031
DATED : August 23, 2022
INVENTOR(S) : Sriram Ranganathan et al.

Page 1 of 1

It is certified that error appears in the above-identified patent and that said Letters Patent is hereby corrected as shown below:

In the Claims

Column 20
Line 2 Claim 10 "….an SOiX state…" should read --….an S0iX state…--
Line 48 Claim 16 "….an input-output (TO) interface…" should read --…. an input-output (IO) interface …--

Signed and Sealed this
Nineteenth Day of November, 2024

*Katherine Kelly Vidal*
*Director of the United States Patent and Trademark Office*